United States Patent
Tsai et al.

[11] Patent Number: 5,892,246
[45] Date of Patent: *Apr. 6, 1999

[54] POLYSILICON TFT HAVING EXACT ALIGNMENT BETWEEN THE SOURCE/ DRAIN AND THE GATE ELECTRODE

[75] Inventors: Hsiung-Kuang Tsai, Taipei; Lee-Tyng Chen, Hsirn, both of Taiwan

[73] Assignee: Industrial Technology Research Institute, Hsin-Chu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 974,020

[22] Filed: Nov. 19, 1997

Related U.S. Application Data

[60] Continuation of Ser. No. 762,484, Dec. 9, 1996, abandoned, which is a division of Ser. No. 663,441, Jun. 13, 1996, Pat. No. 5,602,047.

[51] Int. Cl.$^6$ .................................................. H01L 29/76
[52] U.S. Cl. .............................. 257/66; 257/49; 257/67; 257/72
[58] Field of Search ............................. 257/66, 65, 67, 257/72, 49

[56] References Cited

U.S. PATENT DOCUMENTS

| | | | |
|---|---|---|---|
| 4,943,837 | 7/1990 | Konishi et al. | 257/66 |
| 5,173,753 | 12/1992 | Wu | 257/347 |
| 5,231,297 | 7/1993 | Nakayama et al. | 257/66 |
| 5,262,655 | 11/1993 | Ashida | 257/66 |
| 5,424,230 | 6/1995 | Wakai | 437/40 |
| 5,488,000 | 1/1996 | Zhang et al. | 437/21 |
| 5,548,132 | 8/1996 | Batra et al. | 257/66 |
| 5,554,861 | 9/1996 | Mano et al. | 257/66 |

FOREIGN PATENT DOCUMENTS

| | | | |
|---|---|---|---|
| 481 379 A1 | 4/1992 | European Pat. Off. | 257/66 |
| 4-37169 | 2/1992 | Japan | 257/66 |
| 4-162477 | 6/1992 | Japan | 257/66 |

*Primary Examiner*—Valencia Martin-Wallace
*Attorney, Agent, or Firm*—George O. Saile; Stephen B. Ackerman

[57] ABSTRACT

The source-to-drain gap in a TFT is formed by exposing a positive photoresist from the back side of the substrate, using the gate as an optical mask. The resulting photoresist mask then protects the underlying amorphous silicon while the structure is exposed to a gaseous plasma that includes dopant material. Heavily doped regions are thus formed, leaving a gap that is in perfect alignment with the gate. After removal of the photoresist, the structure is given a laser anneal which results both in the crystallization of the amorphous silicon into polysilicon as well as a more even distribution of the dopant material. The structure is completed in the usual way by providing a passivation layer.

4 Claims, 4 Drawing Sheets

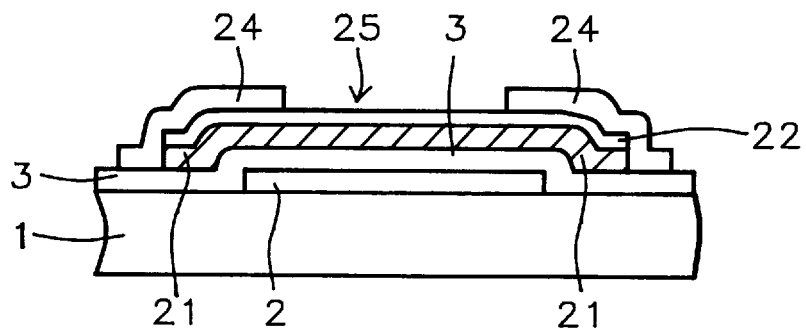
FIG. 1 – Prior Art
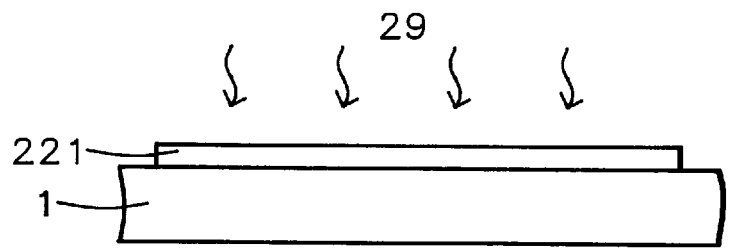
FIG. 2 – Prior Art
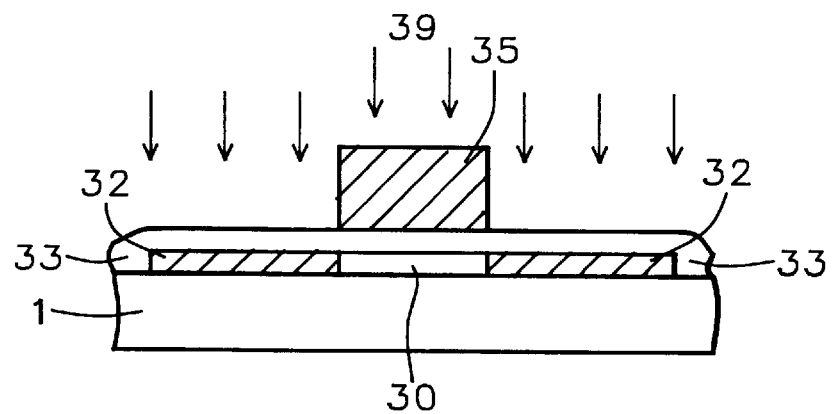
FIG. 3 – Prior Art

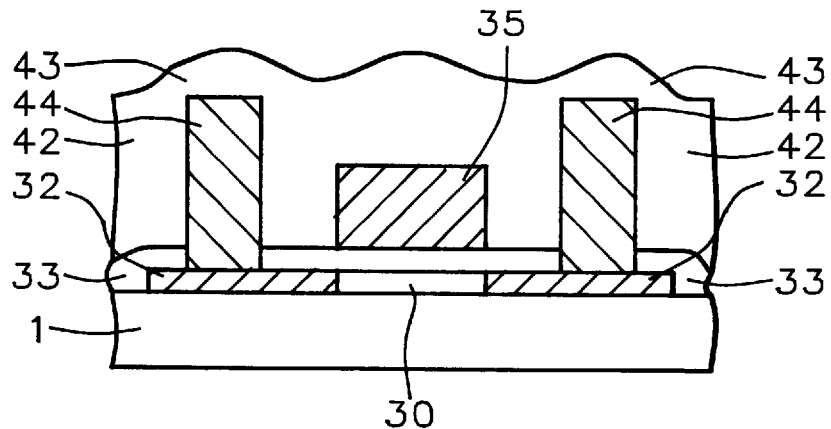
FIG. 4 - Prior Art
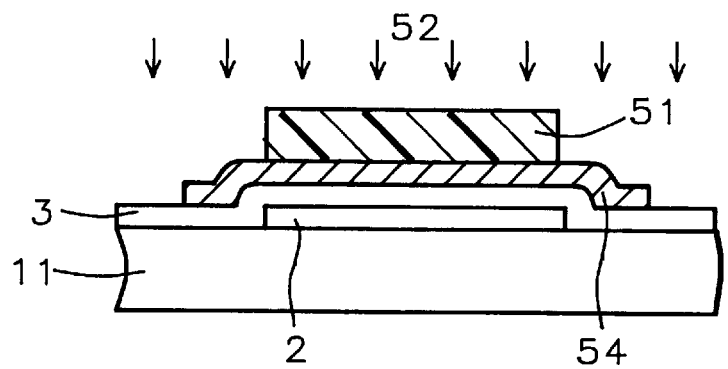
FIG. 5
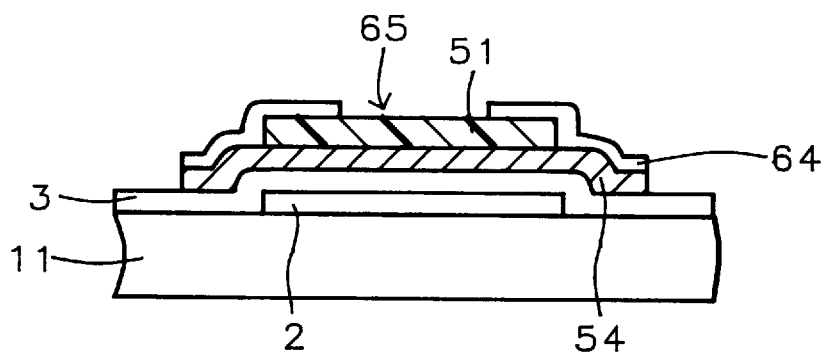
FIG. 6

POLYSILICON TFT HAVING EXACT ALIGNMENT BETWEEN THE SOURCE/ DRAIN AND THE GATE ELECTRODE

This is a continuation of patent application of Ser. No. 08/762,484, filed Dec. 9, 1996, now abandoned which is a divisional patent application of Ser. No. 08/663,441 which was filed on Jun. 13, 1996 and was issued as U.S. Pat. No. 5,602,047 on Feb. 11, 1997.

BACKGROUND OF THE INVENTION (1) Field of the Invention

The invention relates to the general field of thin film transistors, more particularly to improving performance and decreasing manufacturing costs.

(2) Description of the Prior Art

Thin film transistors. (TFTS) have come into widespread use in, among other applications, liquid crystal displays. (LCDs). Most commonly they are fabricated by first laying down a gate electrode on an insulating substrate, then a layer of gate insulation, then a layer of undoped amorphous silicon and then a heavily doped layer of silicon (usually N+) over the preceding silicon layer.

Parasitic capacitances can appear in such a structure in unpredictable ways because of misalignment between source and drain. Additional tolerances must be allowed in the mask design to avoid possible non-contact problems and this can also introduce undesired parasitic capacitances.

An example of a TFT structure, typical of the early prior art, is shown in schematic cross-section in FIG. 1. Gate electrode 2 has been formed on one surface of insulating substrate 1 and then overcoated with gate insulation layer 3 followed by amorphous silicon layer 21 and heavily doped (usually N+) layer of amorphous silicon 22. Layers 21 and 22 were then photolithographically shaped, following which metal layer 24 was deposited over the structure. Conventional photolithography was then again used to partially remove layers 24 and 22 to form gap 25.

In addition to the misalignment and excess overlap problems already discussed, this method has the additional disadvantage that, if underetching occurs during the removal of layer 22, when gap 25 is forming, a certain amount of N+layer 22 will be left on the surface of amorphous silicon layer 21, shorting it out, while, if overetching occurs, the thickness of layer 21 will be less than intended and performance of the device will be degraded. These problems have been partially solved in the prior art through the development of self-aligning techniques, an example of which we will discuss below.

An additional problem associated with the design shown in FIG. 1 is that it is usually difficult to form a low resistance contact between undoped silicon layer 21 and doped silicon layer 22. The latter acts essentially as a metallic contact so that a Schottky barrier is formed between it and the underlying undoped silicon. This problem has been dealt with in the prior art through use of the coplanar structure that we will describe below.

Yet another problem associated with designs such as those of FIG. 1 was their use of amorphous silicon as the active material in the gate region, amorphous silicon having relatively high resistivity even when a conducting channel has been formed on its surface as a result of applying a gate voltage. This problem has been dealt with in the prior art by causing the amorphous silicon to crystallize into polysilicon. This is accomplished by heating the amorphous silicon for a short time at a temperature of at least 600° C. Such a high temperature cannot be applied to an entire structure (such as a LCD) without damaging other parts of it so methods for applying heat very locally for short periods of time (generally several tens of nanoseconds) have been developed. In particular, laser annealing is now widely used for this purpose.

It has been claimed in the prior art by Zhang et al. (U.S. Pat. No. 5,488,000 January 1996) that laser annealing is unreliable primarily because, as the laser is scanned over the areas to be heated, its intensity fluctuates so that uniform results are not obtained. To overcome this problem they teach coating the amorphous silicon with a nucleating layer (for example nickel), prior to crystallization. This allows crystallization to occur at a somewhat lower temperature. We have not found it necessary to use this approach for the method of the present invention.

We now describe a typical prior art method for the manufacture of a TFT that is self-aligned, electrically coplanar (source, drain, and channel lie in the same plane), and uses polysilicon. For more details on the coplanar process and structure, see, for example, Wu (U.S. Pat. No. 5,173,753 December 1992).

Referring now to FIG. 2, the process of the prior art begins with a layer of undoped amorphous silicon 221 that has been deposited onto dielctric substrate 1. Said layer is rapidly and locally annealed by the application of laser beam 29 which causes it to crystallize into polysilicon.

Then, as illustrated in FIG. 3, oxide layer 33 is deposited over layer 221, a metal layer of, for example, chromium is deposited over 33 and then patterned and etched to form gate 35. The structure is then subjected to a high energy dopant ion implantation process 39 which causes dopant to penetrate layer 33 and settle in layer 32, except where they are blocked by gate 35. Thus, after an annealing step, regions 32 become heavily doped polysilicon while region 30 remains undoped and is exactly aligned with gate 39.

The completed structure is as shown in FIG. 4. Dielectric layer 42, usually silicon oxide, is deposited over layer 33. Via holes are then etched through layer 42 down to the level of source/drain regions 32 and filled with conductive plugs 44 which are, in turn, connected to other parts of the circuit (not shown). Finally, passivation layer 43, usually silicon nitride, is deposited over the entire structure.

There are several limitations associated with the prior art process just described. Since the ions that are used to dope the silicon layer must first pass through the gate oxide layer (33) they must have high energy and the introduction of significant radiation damage is unavoidable. Removal of this radiation means higher anneal temperature and/or longer anneal time. Furthermore, in this process there are two separate anneals—one to crystallize the silicon and one to activate the dopant (and remove radiation damage).

Silicon is relatively transparent to near-ultraviolet light, becoming more transparent as the wavelength increases. For example, at a wavelength of about 3300 Angstroms, a layer of silicon about 500 Angstroms thick will reduce the intensity of the light that has passed through it by a factor of about 12, whereas at a wavelength of about 4360 Angstroms, a layer of silicon about 2,000 Angstrom units thick will reduce the intensity of the light that has passed through it by a factor of about 2.7. The present invention takes advantage of this silicon transparency and, in this regard, bears some similarity to pending application ERSO-84-0061.

An example of how this property has been used is shown in FIG. 5. A self-aligned TFT is formed by exposing a layer of positive photoresist to ultraviolet (or near-ultraviolet) light that has been directed to it from the underside of transparent substrate 11. In this manner, the light must pass preformed gate 2 on its way to the photoresist so gate 2 acts as an optical mask. The light must also pass through oxide layer 3 and silicon layer 54 before reaching the photoresist. After development of the photoresist, mask 51 is formed and serves to keep low energy dopant ions from ion stream 52 away from those parts of silicon layer 54 that are directly above gate 2.

In a variation of this process, as shown in FIG. 6, photoresist mask 51 is formed through backside illumination, as before, but instead of doping parts of silicon layer 54 through ion implantation, a layer of heavily doped amorphous silicon 64 is deposited over the structure to make contact with only the parts not covered with photoresist. Opening 65 is then made in layer 64, careful alignment not being necessary as long as said opening underlaps gate 2 and exposes a sufficient amount of mask 51 to allow its easy removal. As part of this removal, any parts of layer 64 that overlap gate 2 are then also removed.

SUMMARY OF THE INVENTION

It has been an object of the present invention to provide a TFT wherein the gap between the source and drain regions is precisely the same as the width of the gate electrode and wherein said gap is located directly above said gate electrode.

Another object of the present invention has been to provide a TFT structure having low contact resistance between the active region of the silicon layer and the contacts thereto.

Still another object of the present invention is that said active region be of polysilicon.

A further object of the present invention has been to provide a TFT that has low drain current for negative gate voltages.

An additional object of the present invention has been to provide a process, for manufacturing such a structure, that is cheaper than existing processes for manufacturing similar structures.

Yet another object of the present invention is that said process not include ion implantation, thereby removing the possibility of radiation damage.

A still further object of the present invention is that, as part of said process, only a single annealing step be used.

These objects have been achieved by using a substrate that is transparent to the radiation used to activate photoresist. The source-to-drain gap is formed by exposing a positive photoresist from the back side of the substrate, using the gate as an optical mask. The resulting photoresist mask then protects the underlying amorphous silicon while the structure is exposed to a gaseous plasma that includes dopant material. Heavily doped regions are thus formed, leaving a gap that is in perfect alignment with the gate. After removal of the photoresist, the structure is given a laser anneal which results both in the crystallization of the amorphous silicon into polysilicon as well as a more even distribution of the dopant material. The structure is completed in the usual way by providing a passivation layer, via holes, and contacting leads.

Because the present invention is a self-aligned structure, the parasitic capacitance formed between the gate and the source is decreased and then kept constant. Consequently, this TFT structure is well suited for the production of a large panel active matrix LCD.

BRIEF DESCRIPTION OF THE DRAWINGS

FIG. 1 is a cross-section of a TFT design typical of the early prior art.

FIG. 2 is a schematic illustration of laser annealing.

FIGS. 3 and 4 illustrate a process for manufacturing a TFT according to more recent prior art.

FIGS. 5 and 6 show the application of exposure from the back side of the substrate, using the gate metal as an optical mask.

DESCRIPTION OF THE PREFERRED EMBODIMENTS

Figure 7:
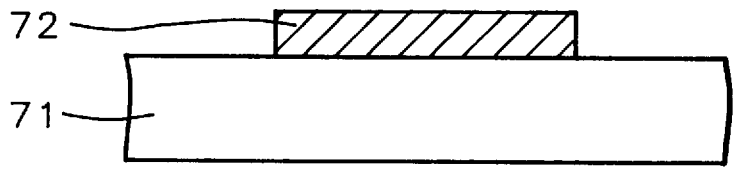
FIGS. 7 through 10 illustrate the TFT manufacturing process of the present invention.

Referring now to FIG. 7, the process of the present invention begins with the provision of dielectric substrate 71 which is transparent to radiation in the range from about 350 to 25,000 Angstroms. This range includes radiation that is suitable for exposing positive photoresist. Our preferred material for the substrate has been borosilicate glass, but other materials such as fused silica or quartz could have been used. A metallic layer of tantalum, chromium, molybdenum, or aluminum is then deposited onto the front surface of 71 to a thickness between about 2,000 and 4,000 Angstroms. It is then patterned and etched to form gate 72.

Figure 8:
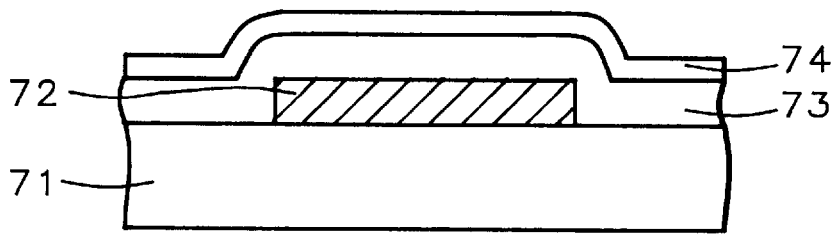

Next, as illustrated in FIG. 8, insulating layer 73, of silicon oxide, silicon nitride, tantalum oxide, or similar material, is deposited to a thickness between about 2,000 and 4,000 Angstroms followed by undoped amorphous silicon layer 74 which is deposited over gate 72 and the surface of substrate 71 to a thickness between about 500 and 1,000 Angstroms using Chemical Vapor Deposition (CVD).

Figure 9:
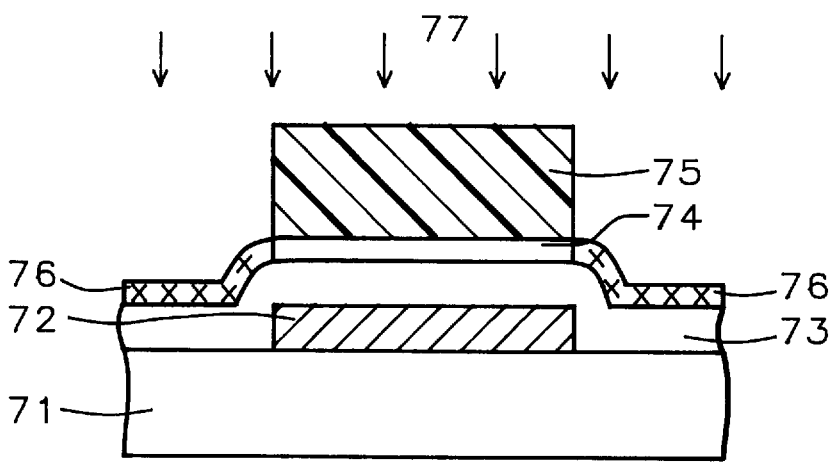

Following this, as illustrated in FIG. 9, undoped amorphous silicon 74 is coated with a layer of positive photoresist which is exposed to actinic radiation, in the wavelength range between about 3,300 and 4,400 Angstroms, coming from the back side of substrate 71. After passing through the lower surface of 71, the radiation passes through layers 73 and 74, but is blocked by gate 72, before it reaches the photoresist. Thus the gate acts as an optical mask so that when the photoresist has been developed, a photoresist mask 75, that is in exact alignment with the gate, is formed.

The structure of FIG. 9 is then exposed to a gaseous plasma, operating at a power level between about 100 and 1,000 watts, that includes dopant material 77, such as arsenic, phosphorus, or boron. This dopant material diffuses into those parts of silicon layer 74 that are not covered by photoresist mask 75, to form heavily doped sublayers 76 (on the upper surface of the silicon layer).

Figure 10:
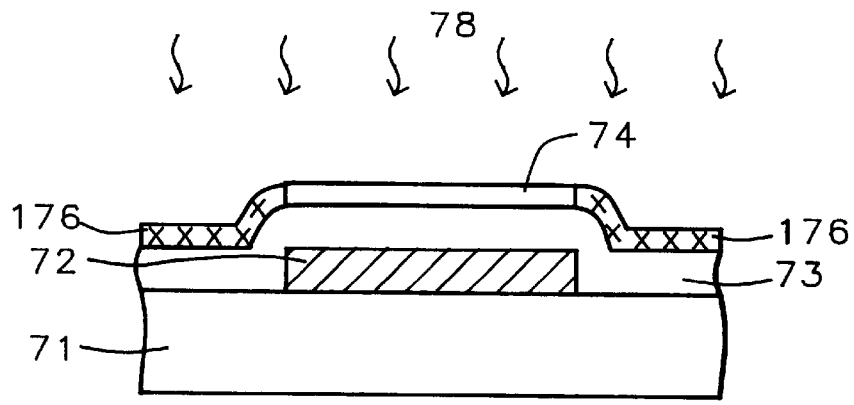

Referring now to FIG. 10, following the removal of photo-resist mask 77, the structure is subjected to a laser anneal from an excimer laser. This is schematically indicated as laser rays 78 in the figure. The laser annealing step accomplishes two thing simulataneously—it causes the amorphous silicon layer to crystallize into polysilicon and it also promotes the diffusion of dopant from the top surface of the silicon (shown as sublayer 76 in FIG. 9) through the full thickness of the layer (shown as 176 in FIG. 10).

Figure 11:
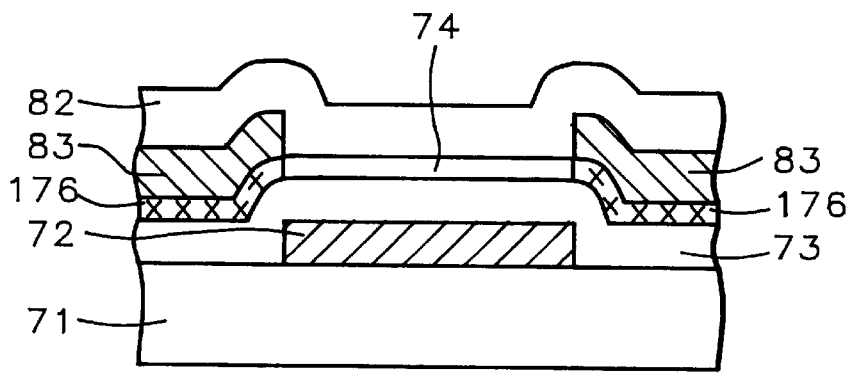
FIG. 11 shows the TFT structure that is the end product of the process taught by the present invention.

To complete the process, another metallic layer of aluminum, titanium, or molybdenum is deposited on the polysilicon layer and then patterned and etched to form source/drain contacts 83 in FIG. 11. As long as care is taken to ensure that contacts 83 do not overlap gate 72, precise alignment between 83 and 72 is not necessary since layer 176 has a low resistance (generally between about $10^2$ and $10^3$ ohms/square). Following the formation of 83, passivation layer 82 of silicon nitride or silicon oxide is deposited to a thickness between about 4,000 and 6,000 Angstroms and bonding pads are formed through passivation layer 82 down to the second metallic layer.

It can thus be seen from FIG. 11 that the end product of this process is a TFT structure consisting of a transparent dielectric substrate 71 on which rests a gate 72 whose width is typically between about 10 and 30 microns. Dielectric layer 73 covers this gate and there is a layer 74 of polysilicon, between about 500 and 1,000 Angstroms thick, over it. This polysilicon layer is undoped (having a sheet resistance between about $10^6$ and $10^8$ ohms/square) wherever it overlies the gate and is heavily doped everywhere else (shown as 176). Metallic source and drain electrodes 83 contact the polysilicon wherever it is heavily doped and passivation layer 82 covers the entire structure.

Figure 12:
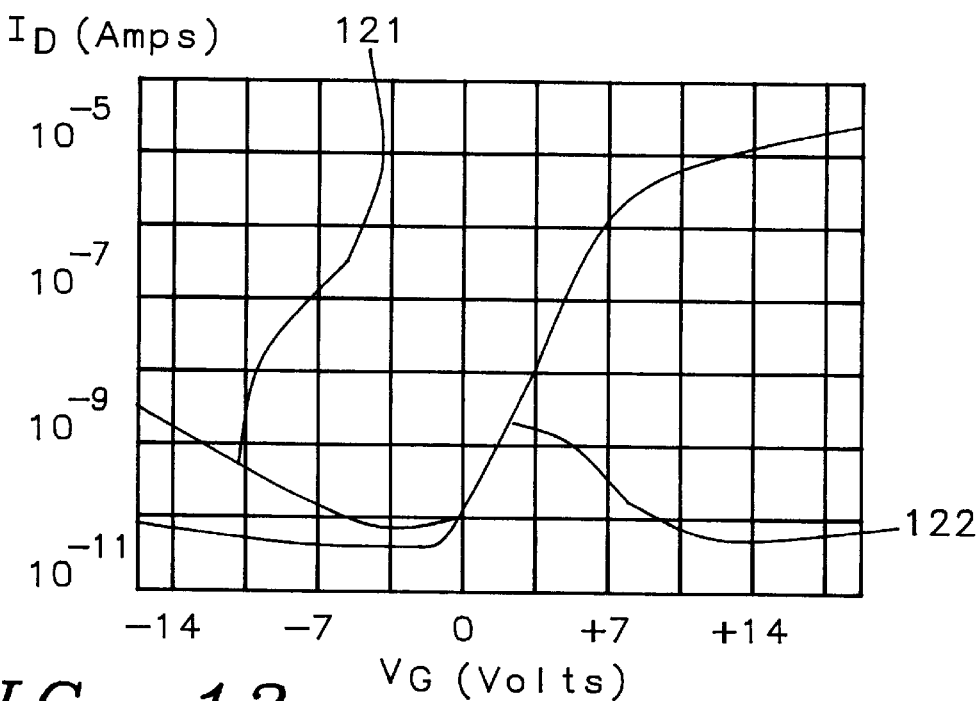
FIG. 12 is a plot of drain current vs. gate voltage for TFTs of the prior art and the present invention.

An important advantage of the structure of FIG. 11, aside from the cheaper process used for its manufacture, is that it can be operated with only a single gate. Coplanar designs of the prior art need a dual gate (or its equivalent) because of an increase in drain current for large negative gate voltages. This is seen in FIG. 12 which is a plot of drain current vs. gate voltage. Curve 121 is for a coplanar TFT of the prior art while curve 122 is for a TFT having the structure of the present invention. As can be seen, for a negative gate voltage of about $-14$ volts the drain currents for these two structures differ by almost two orders of magnitude, with that of the present invention being lower.

While the invention has been particularly shown and described with reference to this preferred embodiment, it will be understood by those skilled in the art that various changes in form and details may be made without departing from the spirit and scope of the invention.

What is claimed is:

1. A thin film transistor structure comprising:

a transparent dielectric substrate;

a gate, having width, on said substrate;

a dielectric layer over said gate;

a layer of polysilicon on said dielectric layer, said polysilicon layer being undoped only over the gate and heavily doped, to a sheet resistance between 100 and 1,000 ohms/sq., everywhere else;

metallic source and drain electrodes on said layer of poly-silicon, wherever the polysilicon is heavily doped; and a passivation layer over the entire structure.

2. The structure of claim 1 wherein the width of said gate is between about 10 and 30 microns.

3. The structure of claim 1 wherein the polysilicon layer has a thickness between about 500 and 1,000 Angstroms.

4. The structure of claim 1 wherein the undoped polysilicon layer has a sheet resistance between about $10^6$ and $10^8$ ohms/sq.

* * * * *